United States Patent
Chen

(10) Patent No.: US 7,112,836 B2
(45) Date of Patent: Sep. 26, 2006

(54) METHOD OF FORMING A CHALCOGENIDE MEMORY CELL HAVING A HORIZONTAL ELECTRODE AND A MEMORY CELL PRODUCED BY THE METHOD

(75) Inventor: Yi Chou Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/802,312

(22) Filed: Mar. 17, 2004

(65) Prior Publication Data

US 2005/0205964 A1 Sep. 22, 2005

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/295; 257/19; 257/63; 257/310; 257/E31.027; 257/E31.029

(58) Field of Classification Search .................. 257/19, 257/63, 295, 310, E31.027, E31.029
See application file for complete search history.

(56) References Cited

U.S. PATENT DOCUMENTS

| | | | |
|---|---|---|---|
| 6,031,287 A | 2/2000 | Harshfield | |
| 6,111,264 A | 8/2000 | Wolstenholme et al. | |
| 6,114,713 A | 9/2000 | Zahorik | |
| 6,737,312 B1 * | 5/2004 | Moore | 438/238 |
| 6,815,818 B1 * | 11/2004 | Moore et al. | 257/751 |
| 2001/0002046 A1 * | 5/2001 | Reinberg et al. | 257/3 |
| 2003/0122166 A1 * | 7/2003 | Lai | 257/246 |
| 2004/0110094 A1 * | 6/2004 | Chen et al. | 430/311 |
| 2004/0113136 A1 * | 6/2004 | Dennison | 257/2 |
| 2004/0248339 A1 * | 12/2004 | Lung | 438/102 |

* cited by examiner

*Primary Examiner*—Jerome Jackson
*Assistant Examiner*—Jesse A. Fenty
(74) *Attorney, Agent, or Firm*—Stout, Uxa, Bayan & Mullins, LLP

(57) ABSTRACT

A horizontal electrode having a small cross-section makes electrical contact with a chalcogenide memory element. The dimensions of the cross-section are controlled by conventional deposit/etch semiconductor processing steps. The resulting memory element can be driven by a CMOS steering element.

11 Claims, 9 Drawing Sheets

METHOD OF FORMING A CHALCOGENIDE MEMORY CELL HAVING A HORIZONTAL ELECTRODE AND A MEMORY CELL PRODUCED BY THE METHOD

BACKGROUND OF THE INVENTION

1. Field of the Invention

The present invention relates generally to semiconductor fabrication methods and, more particularly, to fabrication of a chalcogenide memory cell.

2. Description of Related Art

Electrically writable and erasable phase change materials have been used for memory devices. Chalcogenide materials can be electrically switched between two structural states of generally crystalline and generally amorphous local order. The generally crystalline state is a phase in which the material's atoms and/or electrons form a repeatable lattice structure, whereas the atoms and/or electrons of the generally amorphous state are randomly distributed. The structural state can also be switched among a range of detectable structural states of local order between the extremes of completely crystalline and completely amorphous states.

The currently favored chalcogenide materials that are used for phase change memory applications typically contain mixtures of Te, Se, Ge, Sb, Bi, Pb, Sn, As, S, Si, P, and/or O. Because of the range of structural states, a given as-deposited stoichiometric chalcogenide material can have varied bulk conductivities. Generally speaking, the more crystalline local order the state has, the higher the conductivity of the material. Moreover, the conductivity of the material can be selectively and repeatably established via an electrical pulse of given voltage and duration, herein called a setting or resetting voltage. The conductivity remains stable until another setting or resetting voltage of comparable size is applied. Furthermore, the conductivity of the material appears to vary inversely with the setting or resetting voltage and does not depend upon the previous state of the material, i.e., the material lacks hysteresis.

The aforementioned materials can be used to store and retrieve information within a non-volatile, overwritable memory cell. When different setting or resetting voltages are employed to change the conductivity of the material, the corresponding conductivities can be distinguished by various means including, but not limited to, the application of a relatively smaller voltage across the material within the cell. If, for example, two distinct setting or resetting voltages are used, one memory cell is able to store and retrieve one bit of binary encoded data. If more than two distinct setting or resetting voltages are used, then one memory cell is able to store and retrieve an analog form that can represent multiple bits of binary encoded data. Since the chalcogenide materials are able to maintain their respective conductivities, the memory cells are non-volatile, in that no refreshes are necessary to keep the data stored. The memory cells can also be directly overwritten, meaning that no data erasures are necessary prior to storing new data within the cells.

It is known that chalcogenide phase change memory is not easy to incorporate into a CMOS circuit because the chalcogenide material requires a relatively high current density to change its state. Reducing the cross-sectional area of the chalcogenide part can reduce the current requirement in direct proportion. Structures which have been developed and which reduce this cross-sectional area involve fabricating ultra small contacts and depositing the chalcogenide into the contacts. One of the methods of fabricating ultra small contacts involves using a dielectric film, i.e., a spacer, to further reduce the photolithographic limit as referenced in U.S. Pat. No. 6,111,264. This technique can reduce the cross-sectional area, but the shrinking ratio is limited by the spacer thickness. For example, if the pore diameter is 1600 Å and the spacer thickness is 400 Å, the shrinkage area ratio is only about 4:1. The minimum pore diameter is determined by the photolithography and the spacer thickness. The shrinkage ratio can be limited. Thus, it can be difficult to scale down the chalcogenide parts in this fashion. If the chalcogenide parts cannot be scaled down, then relatively large current is required to cause a state change in the material. A requirement for larger current corresponds to a requirement for greater power to operate an array of such memory cells.

There can be additional problems once the pores are scaled down. For instance, the uniformity of the pore-to-pore diameters can be poor. Moreover, the small pores can place constraints on the chalcogenide deposition process since it will be more difficult to deposit materials into the tiny openings. For example, in the context of pores formed using the process of the preceding paragraph, overhang of the spacer may partially or fully occlude the pore, further compromising the reliability of the deposition procedure. Additionally, if the bottoms of the pores receive poor bottom coverage, the electrodes beneath them would not be able to predictably change the phases of the chalcogenide parts. If the phases are not repeatable when a given current is applied, the memory cell cannot reliably store data.

A need thus exists in the prior art for an electrode with a small cross-section for making reliable contact with a chalcogenide switching device. A further need exists for a fabrication method for precisely controlling the size of a small-cross-section electrode.

SUMMARY OF THE INVENTION

The present invention addresses these needs by providing a method for fabricating a memory cell comprising an electrode with a relatively small cross-section that makes operative contact with phase change material. In illustrative embodiments, the phase change material may comprise chalcogenide material. The method creates an area of contact between the electrode and the phase change material that can be relatively small, by employing deposition and etch processes that are known in the art of semiconductor fabrication. The invention disclosed herein includes a method for forming a memory cell comprising forming at least one bottom electrode on a substrate. In particular, an embodiment of the method comprises forming at least one bottom electrode on a sidewall of a pad formed on the substrate. The method still further comprises providing phase change material at least partially disposed on the substrate beside the at least one bottom electrode, the phase change material making operative contact with the at least one bottom electrode.

An exemplary embodiment of the invention comprises a memory cell including a conducting element at least partially disposed within a substrate. This embodiment further comprises a bottom electrode at least partially disposed on the substrate such that the bottom electrode is operatively connected with the conducting element. The embodiment still further comprises a phase change material at least partially disposed on the substrate, the phase change material being operatively coupled with the bottom electrode.

Another exemplary embodiment of the invention comprises an array of memory cells formed at least partially in a substrate and organized into rows and columns with a memory cell at the intersection of each row and column. Each memory cell in the array includes a transistor having a source, a drain, and a gate disposed within the substrate. The gates of transistors in each column are operatively connected with a common word line. The drains of transistors in each row are operatively connected with a common bit line. The memory cell located at each row-column intersection in the array comprises a conducting element at least partially disposed within the substrate, the conducting element being operatively connected with the source of the transistor in the memory cell. The memory cell further comprises a pad disposed on the substrate with a bottom electrode formed on a sidewall of the pad such that the bottom electrode is operatively coupled with the conducting element. A phase change material that, according to an exemplary embodiment, comprises chalcogenide material, is at least partially disposed on the substrate, making operative contact with the bottom electrode. A top electrode, disposed on the phase change material, makes operative contact with the phase change material.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims that follow.

DETAILED DESCRIPTION OF THE PRESENTLY PREFERRED EMBODIMENTS

Figure 1:
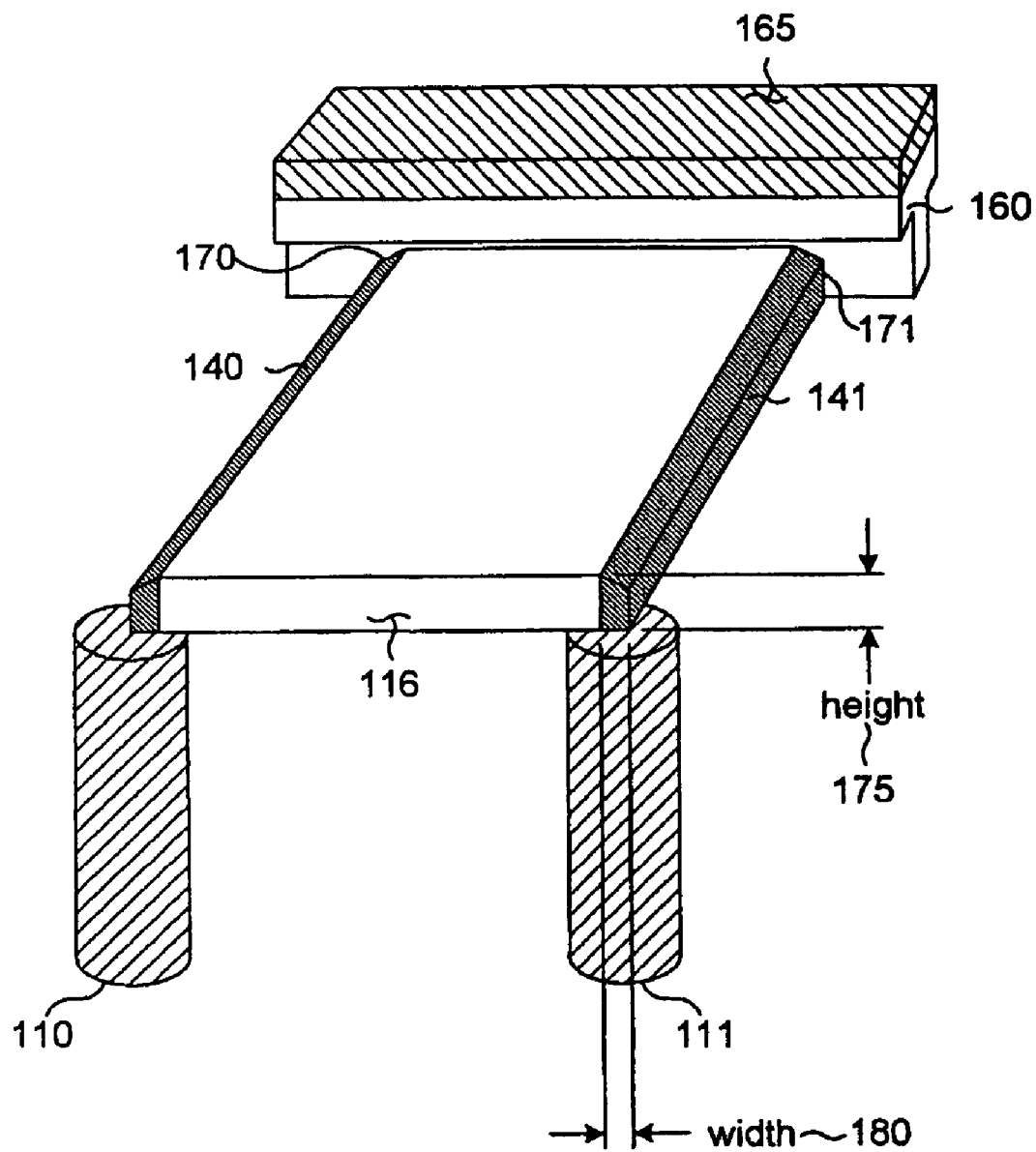
FIG. 1 is a perspective diagram that illustrates an overview of an embodiment of a pair of memory cells produced by an implementation of the method of the present invention.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of chalcogenide memory cells. The present invention may be practiced in conjunction with various integrated circuit fabrication techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to a chalcogenide memory cell and to a method of fabricating an electrode having a small cross-section that makes contact with chalcogenide material.

Referring more particularly to the drawings, FIG. 1 is a perspective diagram that illustrates an overview of an embodiment of a pair of memory cells produced by an implementation of the method of the present invention. A typical memory cell may comprise a steering element, e.g. a transistor (not shown), disposed within a substrate. A terminal of such a steering element may be operatively coupled to a conducting element, e.g. a tungsten plug. The embodiment depicted in FIG. 1 comprises two such conducting elements 110 and 111, and further comprises two bottom electrodes 140 and 141 formed on opposing sidewalls of a pad layer 116. The illustrated embodiment further comprises phase change material 160 that makes operative contact with the bottom electrodes 140 and 141 at contact surfaces 170 and 171. According to this illustrative embodiment, a first steering element (not shown) directs current to the conducting element 110, and a second steering element (not shown) directs current to the conducting element 111. The bottom electrodes 140 and 141, being operatively connected to respective conducting elements 110 and 111, direct current to the phase change material 160. A top electrode 165 further may be formed on the phase change material 160.

Figure 2:
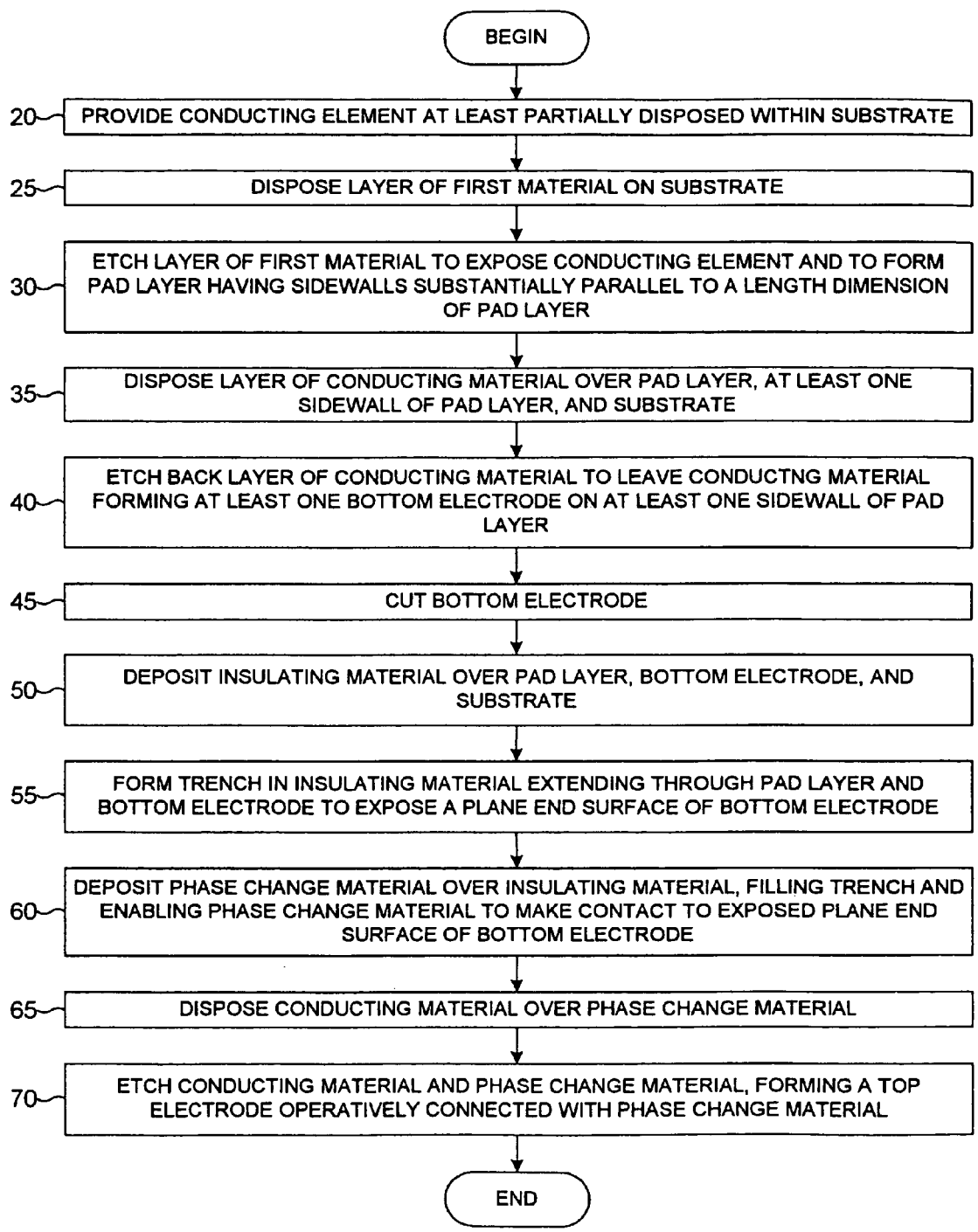
FIG. 2 is a flow diagram that describes an implementation of a method for forming a memory cell according to the present invention.

FIG. 2 is a flow diagram that describes an implementation of a method for forming a memory cell according to the present invention. To summarize the steps of the method, a conducting element is provided in a substrate at step 20; a bottom electrode is formed on the substrate at steps 25, 30, 35, 40, and 45; a phase change material is disposed on the substrate beside the bottom electrode at steps 50, 55, and 60; and a top electrode is provided at steps 65 and 70. Each of these steps of the method will now be described in greater detail.

Figure 3:
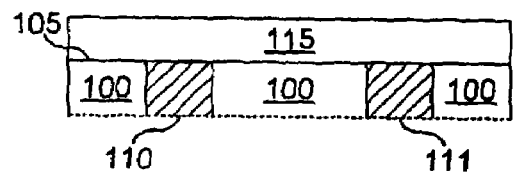
FIG. 3 is a cross-sectional view (the "reference cross-section") illustrating the result of early steps of an implementation of a method for forming a bottom electrode.

FIG. 3 is a cross-sectional view that illustrates the result of early steps of an implementation of a method for forming a bottom electrode. The cross-section illustrated in FIG. 3, as modified by various steps of the method, is referred to in what follows as the reference cross-section. With reference to FIG. 2 and FIG. 3, the illustrated implementation of the method of the invention provides at step 20 a conducting element 110 at least partially disposed within a substrate 100. FIG. 3 shows two such conducting elements 110 and 111. The conducting elements 110 and 111 may be formed, for example, of tungsten. According to an exemplary embodiment, the substrate, is formed of silicon.

Formation of bottom electrodes 140, 141 (FIG. 1) begins by disposing a layer of first material 115 on a surface 105 of the substrate 100 at step 25. The layer of first material 115 may be formed of dielectric material such as silicon nitride, silicon dioxide, silicon oxynitride or the like. According to an exemplary embodiment, the layer of first material 115 is deposited on the substrate 100 using a physical enhanced oxidation (PEOX) process.

Figure 4:
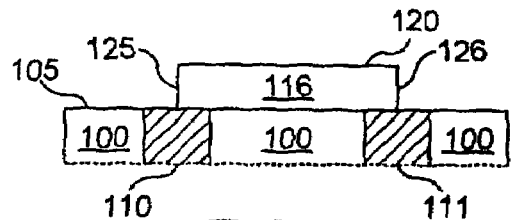
FIG. 4 is a view of the reference cross-section after formation of a pad layer.

FIG. 4 is a view of the reference cross-section after formation of a pad layer 116. The layer of first material 115 may be patterned and etched at step 30 to expose the conducting elements 110 and 111 and to form the pad layer 116. The illustrated embodiment of the pad layer 116 has sidewalls 125 and 126 oriented parallel to a length dimension of the pad layer 116. The length dimension is perpendicular to the plane of the diagram of FIG. 4. More precisely, the pad layer 116 has an upper surface 120 and a lower surface that makes contact with the surface 105 of the substrate 100. The sidewalls 125 and 126 are disposed between the upper surface 120 and the lower surface of the pad layer 116. The etch process that forms the pad layer 116 may be an anisotropic etch in which the etchant has a higher selectivity for the layer of first material 115 than for the material of the substrate 100 and the two conducting elements 110 and 111.

Figure 5:
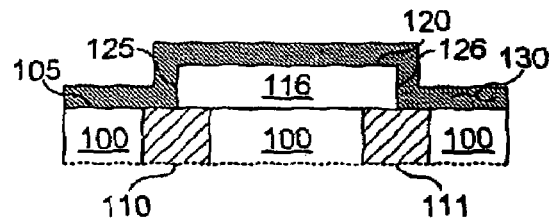
FIG. 5 is a view of the reference cross-section illustrating a conducting layer formed on the pad layer.

FIG. 5 is a view of the reference cross-section that illustrates a conducting layer 130 formed on the pad layer 116. The conducting layer 130 may be formed on the upper surface 120 of the pad layer 116, the sidewalls 125 and 126 of the pad layer 116, and the substrate 100 at step 35. It should be noted that the conducting layer 130 makes contact with the conducting elements 110 and 111. The conducting layer 130 may be composed of tantalum nitride, titanium nitride, titanium tungstide, titanium, tungsten, doped polysilicon, combinations of these materials, or the like.

Figure 6:
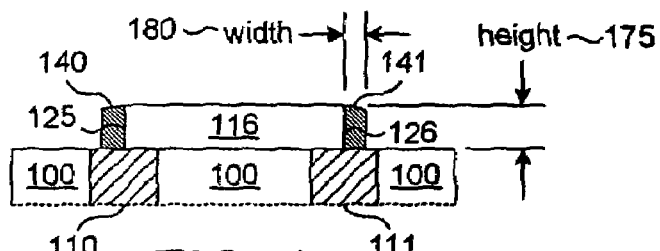
FIG. 6 is a view of the reference cross-section illustrating the result of removing portions of the conducting layer.
Figure 7:
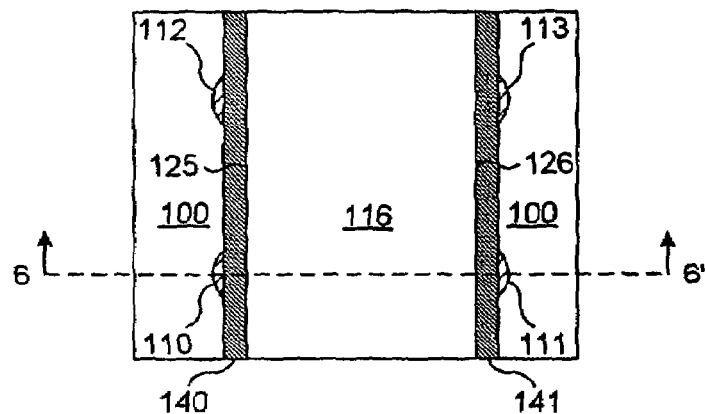
FIG. 7 is a plan view of the cross-sectional view of FIG. 6.

FIG. 6 is a view of the reference cross-section that illustrates the result of removing portions of the conducting layer 130. An etch can be performed at step 40 to remove portions of the conducting layer 130 that overlie the upper surface 120 of the pad layer 116 and the surface 105 of the substrate 100. The portions of the conducting layer 130 on the sidewalls 125 and 126 of the pad layer 116 are not removed in the illustrated embodiment. Bottom electrodes 140 and 141 are thus formed on sidewalls 125 and 126 of the pad layer 116 as a result of the etch performed at step 40. FIG. 7 is a plan view of the cross-sectional view of FIG. 6. The cross-sectional view, i.e. the reference cross-section, of FIG. 6 is taken along line 6–6' in FIG. 7.

The etch process that removes portions of the conducting layer 130 at step 40 may comprise an anisotropic etch process in which the etchant has a higher selectivity for the conducting layer 130 than for the material forming the substrate 100, the conducting elements 110, 111 and the pad layer 116. The plan view of FIG. 7 shows four conducting elements 110, 111, 112, and 113, each being partially exposed after step 40. Following step 40, bottom electrode 140 makes contact with conducting elements 110 and 112, and bottom electrode 141 makes contact with conducting elements 111 and 113.

In the embodiment illustrated in FIG. 6, the width 180 of the bottom electrodes 140 and 141 is at least partially controlled by the thickness of the conducting layer 130. According to an illustrative embodiment, the conducting layer 130 is deposited using a reactive sputtering or sputtering or chemical vapor deposition (CVD) process. Use of this exemplary process permits the thickness of the conducting layer 130 to be precisely controlled by deposition time. Typically, the thickness of the conducting layer 130 can range from about 50 Å to about 1000 Å and according to an exemplary embodiment is about 200 Å. The width 180 of each of the bottom electrodes 140 and 141 further may be controlled by the anisotropic etch process. The effect on the width 180 of each of the bottom electrodes 140 and 141 can be controlled, for example, by controlling the degree of anisotropy of the etch. For example, the etch process may comprise dry etching. The height 175 of the bottom electrodes 140 and 141 in the embodiment illustrated in FIG. 6 is substantially the same as the height of the pad layer 116. The height of the pad layer 116, in turn, depends upon the thickness of the layer of first material 115. The deposition process used to form the layer of first material 115 can control the thickness of the layer of first material 115 by PEOX, thereby permitting precise control of the height 175 of the conducting material of the bottom electrodes 140 and 141. According to typical embodiments, the thickness of the layer of first material 115 can range from about 50 Å to about 2000 Å and in an exemplary embodiment can be about 500 Å.

It will be understood by those skilled in the art that the method herein described for precisely controlling the height 175 and width 180 of the bottom electrodes 140 and 141 can facilitate the provision of bottom electrodes having relatively small cross-sectional areas. For example, if the height 175 of the pad layer 116 is about 500 Å and the thickness of the conducting layer 130 (i.e. the width 180 of the bottom electrodes 140 and 141) is about 200 Å, then the resulting cross-sectional area of each of the bottom electrodes 140 and 141 may be about $10^5$ Å$^2$. This area corresponds to a circular diameter of about 0.036 microns or a square area about 0.032 microns on a side. The method of the invention therefore may result in contact areas that are considerably smaller than those achievable by many methods in the current state of the art.

Figure 8:
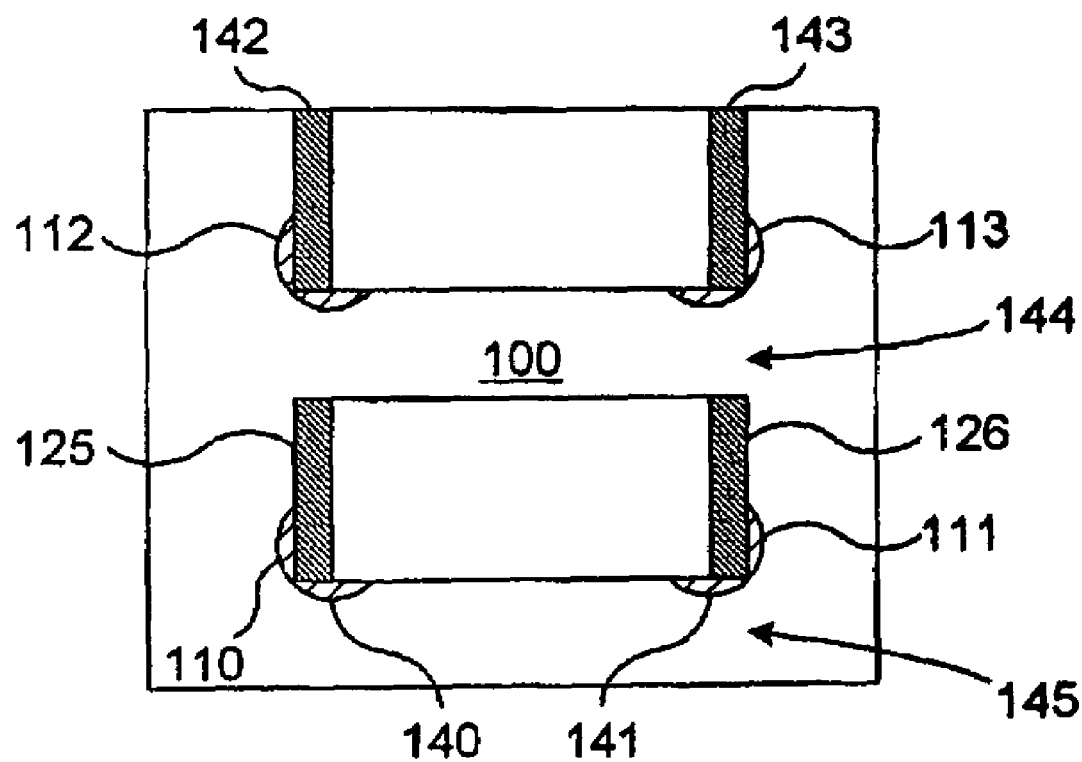
FIG. 8 is a plan view that depicts the result of cutting bottom electrodes.

FIG. 8 is a plan view that depicts the result of cutting the bottom electrodes 140 and 141. Preparatory to providing phase change material 160 (FIG. 1), the bottom electrode 140 may be cut at step 45. Cutting bottom electrode 140, according to an exemplary implementation of the method, comprises removing a portion of the bottom electrode 140 and the pad layer 116. The removal of the bottom electrode 140 exposes a portion of the surface 105 of the substrate 100 in a direction transverse to the length dimension of the pad layer 116. Cutting the bottom electrode 140 further may comprise cutting bottom electrode 141. Cutting the bottom electrodes 140 and 141 can be accomplished by patterning and etching the bottom electrodes 140 and 141 and the pad layer 116, using well-known techniques, to form a gap 144 oriented in a direction transverse to the length dimension of bottom electrodes 140 and 141. In the embodiment illustrated in FIG. 8, the cut to the bottom electrodes 140 and 141 creates two additional bottom electrodes 142 and 143, respectively, that make operational contact with respective conducting elements 112 and 113. The cut to the pad layer 116 further creates an additional pad layer 117. FIG. 8 also shows another cut to the pad layer 116 that is associated with a corresponding gap 145. Bottom electrodes 142 and 143 may be associated with adjacent memory cells (not shown). Following step 45, a total of four bottom electrodes 140, 141, 142, and 143 have been formed in the illustrated embodiment. The bottom electrodes 140, 141, 142, and 143 make operative electrical contact with respective conducting elements 110, 111, 112, and 113.

Figure 9:
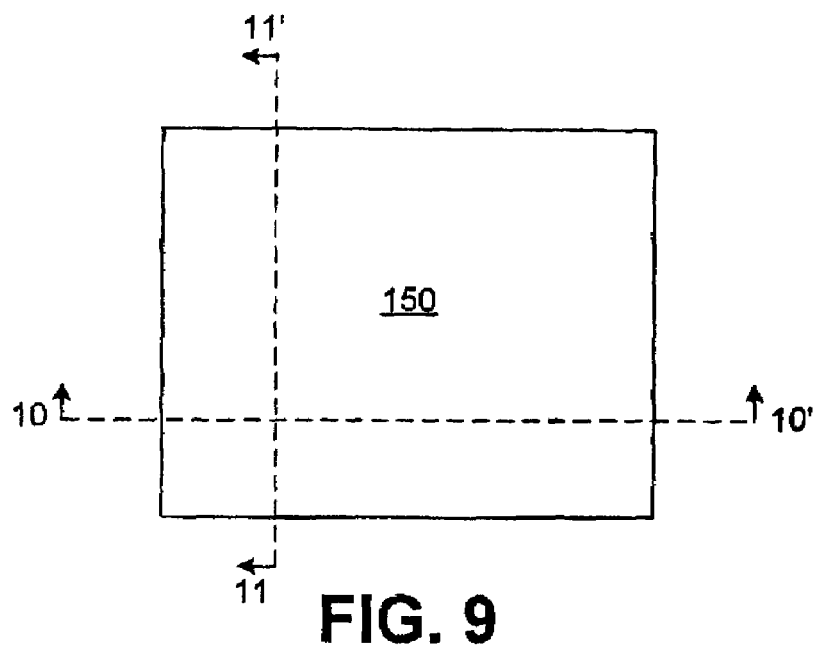
FIG. 9 is a plan view that illustrates the result of depositing a layer of insulating material.
Figure 10:
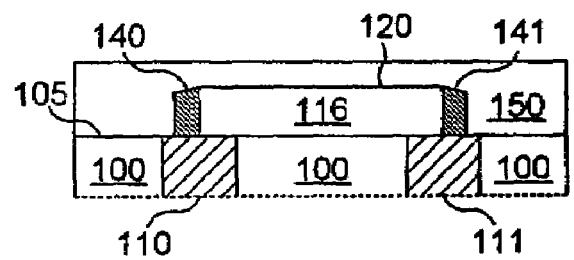
FIG. 10 is a view of the reference cross-section after formation of the layer of insulating material.
Figure 11:
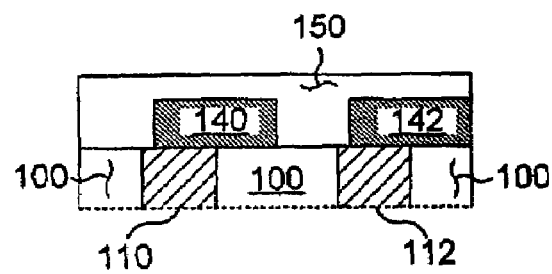
FIG. 11 is a cross-sectional view, taken along line 11–11' in FIG. 9, of the result of depositing the layer of insulating material.

Preparatory to providing phase change material 160 (FIG. 1), an insulating barrier is formed to provide isolation between for example bottom electrodes 142 and 143 and the phase change material 160 (FIG. 1) to be deposited at a later step. In one implementation of the inventive method, a requisite insulating barrier can be formed by depositing at step 50 a layer of insulating material 150. The layer of insulating material 150 may be deposited over the surfaces of pad layers 116 and 117, bottom electrodes 140, 141, 142, and 143, optionally on the conducting elements 110, 111, 112, and 113, and the exposed surface 105 of the substrate 100. FIG. 9 is a plan view that illustrates the result of depositing the layer of insulating material 150, and FIG. 10 is a view of the reference cross-section after formation of the layer of insulating material 150. The cross-section of FIG. 10 is taken along line 10–10' of FIG. 9. FIG. 11 is a cross-sectional view taken along line 11–11' in FIG. 9 showing the result of depositing the layer of insulating material 150.

According to typical embodiments, the layer of insulating material 150 may be formed of silicon oxynitride, silicon dioxide, or zinc sulfide. In an exemplary embodiment, wherein the layer of insulating material 150 comprises SiN, SiO2, or SiON, the layer of insulating material 150 can be formed using a CVD or physical enhanced (PE)-CVD technique. The thickness of the layer of insulating material 150 according to typical embodiments can range from about 50 Å to about 1000 Å and in an exemplary embodiment can be about 200 Å as measured from the upper surface 120 of the pad layer 116 to the exposed surface of the layer of insulating material 150.

Figure 12:
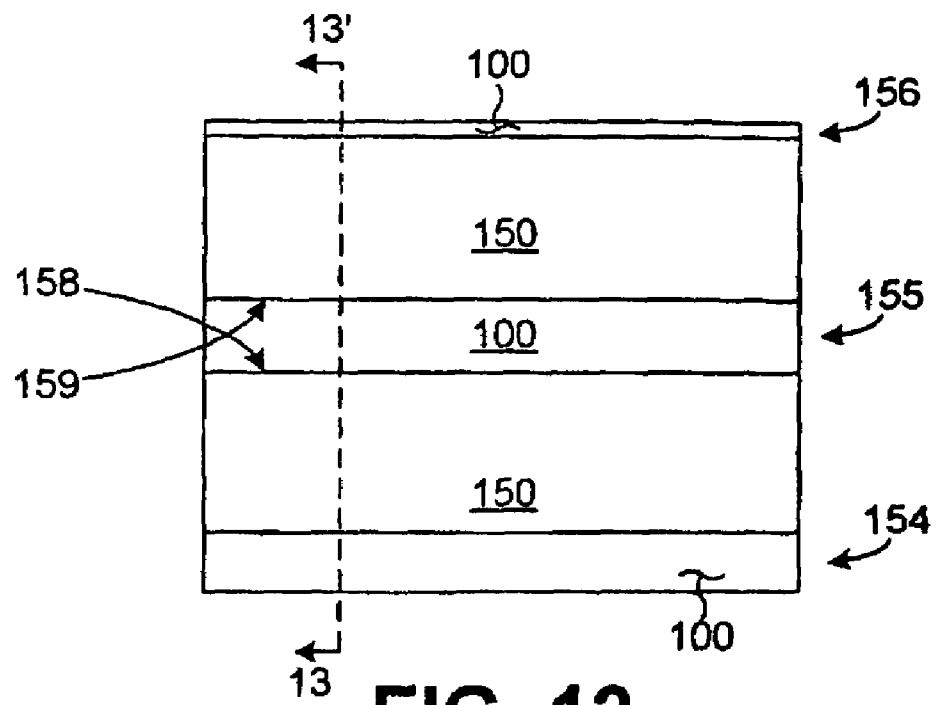
FIG. 12 is a plan view of the structure of FIG. 9 following formation of trenches in the layer of insulating material.
Figure 13:
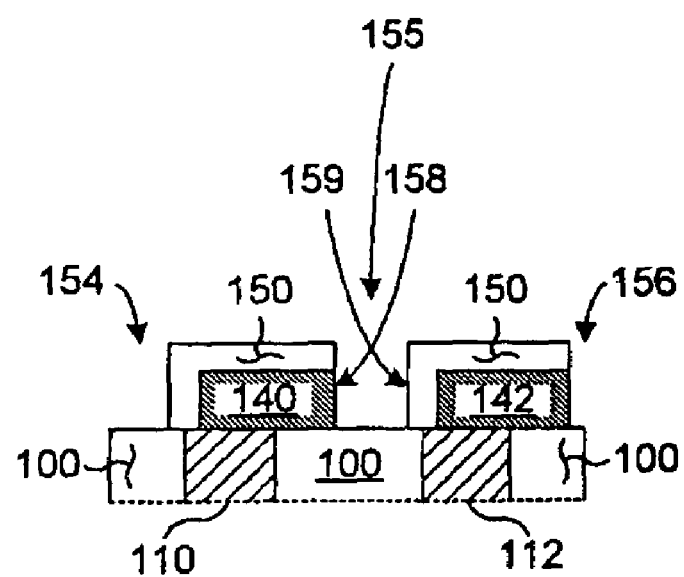
FIG. 13 is a cross-sectional view taken along the line 13–13' of FIG. 12.

FIG. 12 is a plan view of the structure of FIG. 9 following formation of a trench 155 in the layer of insulating material 150 at step 55. In the illustrated embodiment the trench 155 forms a substantial right angle with the length dimension of the pad layer 116. FIG. 13 is a cross-sectional view taken along the line 13–13' of FIG. 12. The trench 155, which may be formed by patterning and etching the insulating material 150 using well-known techniques, extends between the pad layers 116, 117, and further extends between the bottom electrodes 140, 142 and 141, 143, effectively again separating the pad layer 116 and bottom electrodes 140 and 141 from the pad layer 117 and bottom electrodes 142 and 143. According to the illustrated embodiment, the trench 155, as formed, comprises two sides 158 and 159. Side 158 effectively cuts or separates bottom electrodes 140 and 141, thereby determining the lengths of bottom electrodes 140 and 141. Side 159 of the trench 155 is positioned to leave a portion of the layer of insulating material 150 on ends of bottom electrodes 142 and 143. The portion of the layer of insulating material 150 that remains on the ends of the bottom electrodes 142 and 143 following step 55 forms an insulating barrier that isolates bottom electrodes 142 and 143 from the phase change material 160 (FIG. 1) to be deposited at a later step.

The etch process used to form the trench 155 may be a multi-step etch process in embodiments wherein, for example, parts of the bottom electrodes 140 and 141 are etched. One step of the process may employ an etchant having a selectivity for the insulating material 150 that is high relative to a selectivity for the material that forms the bottom electrodes 140 and 141. Another step of the etching process may employ an etchant having a selectivity that is higher for the material forming the bottom electrodes 140 and 141 than for, for example, the material of the substrate 100. It should be noted that the bottom electrodes 140 and 141 lie on the surface 105 of the substrate 100 and thus extend substantially parallel to the surface 105 of the substrate 100. Cutting the bottom electrodes 140 and 141 thus exposes a plane end surface of the cross-section of each of the bottom electrodes 140 and 141 at edges (e.g., vertical edges) of the trench 155.

In the embodiment illustrated in FIGS. 12 and 13, two optional trenches 154 and 156 are shown. Forming optional trench 156 may determine the lengths of bottom electrodes 142 and 143, and forming optional trench 154 may determine the lengths of additional bottom electrodes associated with adjacent memory cells (not shown).

Figure 14:
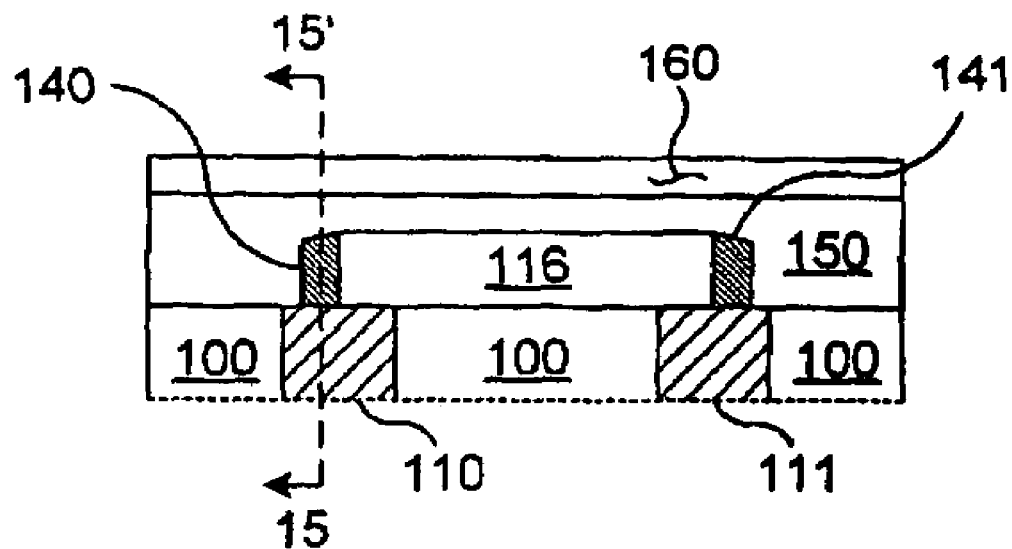
FIG. 14 is a view of the reference cross-section after deposition of phase change material.
Figure 15:
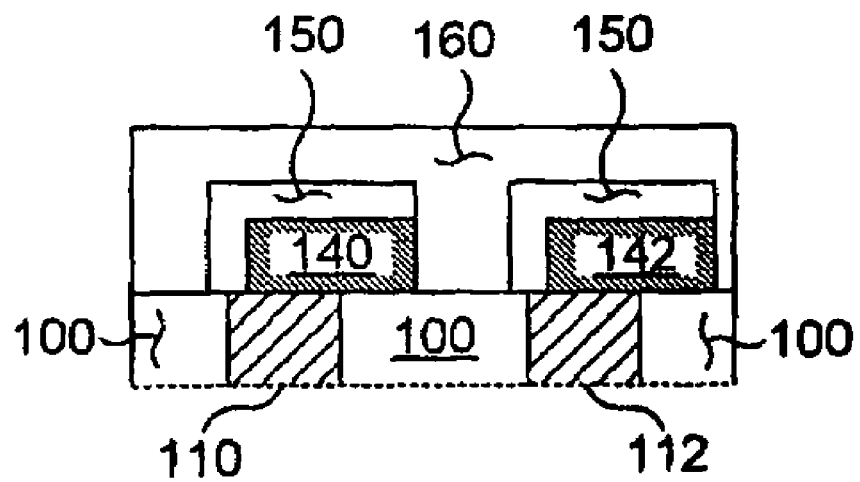
FIG. 15 is a cross-sectional view taken along the line 15–15' in FIG. 14.

FIG. 14 is a view of the reference cross-section after deposition of phase change material. FIG. 15 is a cross-sectional view taken along the line 15–15' in FIG. 14. With reference to these figures and continued reference to FIG. 2, phase change material 160 can be deposited at step 60 over the insulating material 150 and into the trench 155. The cross-sectional view of FIG. 15 corresponds to the structure of FIG. 13 following formation of the phase change material 160 thereover. The thickness of the layer of phase change material 160 over the layer of insulating material 150 in typical embodiments can range from about 50 Å to about 1000 Å and in an exemplary embodiment can be about 200 Å. According to a representative embodiment of the present invention, the phase change material 160 comprises a chalcogenide material, which is deposited using a sputtering process. In modified embodiments, the phase change material 160 may comprise Ge—Sb—Te, Ag—In—Sb—Te, Ge—Te, Ge—Sb, or other chalcogenide material.

The phase change material 160, thus deposited, establishes operative contact with the plane end surfaces of the bottom electrodes 140 and 141 at contact surfaces 170 and 171 (FIG. 1). The areas of the contact surfaces 170 and 171 are controlled by the width 180 and height 175 of the bottom electrodes 140 and 141. In accordance with an aspect of the present invention, these areas can be made extremely small in comparison to prior-art techniques by implementation of the above-described method.

Figure 16:
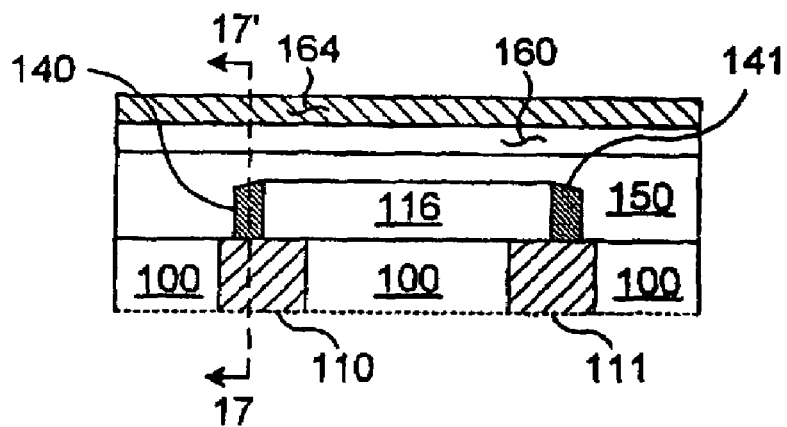
FIG. 16 is a view of the reference cross-section after formation of a layer of conducting material.
Figure 17:
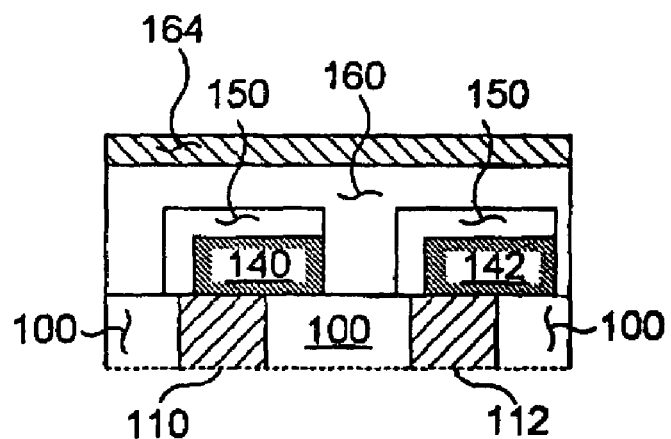
FIG. 17 is a cross-sectional view taken along line 17—17' in FIG. 16.

FIG. 16 is a view of the reference cross-section after formation of a layer of conducting material, and FIG. 17 is a cross-sectional view taken along line 17–17' in FIG. 16. At step 65 of the method of FIG. 2, and as shown in FIGS. 16 and 17, a layer of conducting material 164 can be formed over the phase change material 160. The layer of conducting material 164 may be composed of Ti, TiN, Al, Cu, TaN, Ta, or W or the like, and may be formed using a sputtering, reactive sputtering or electrical plating process. The thickness of the layer of conducting material over the phase change material 160 may range from about 50 Å to about 5000 Å in typical embodiments and in an exemplary embodiment may be about 1000 Å.

Figure 18:
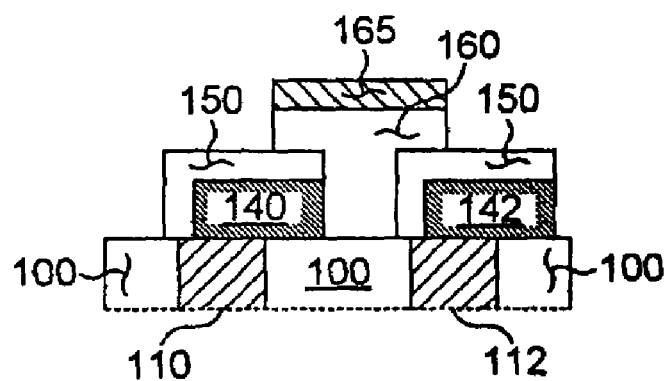
FIG. 18 is a cross-section of the view illustrated in FIG. 17 after an etch step.

FIG. 18 is a cross-section of the view illustrated in FIG. 17 after an etch step. With reference to FIGS. 16, 17, and FIG. 18, and with continuing reference to FIG. 2, the layer of conducting material 164 and the layer of phase change material 160 may be etched at step 70 to form the top electrode 165 operatively connected with the phase change material 160. In an exemplary embodiment, the etch process used to form the top electrode 165 may comprise a multi-step etch process. One step of the process may employ an etchant having a selectivity for the layer of conducting material 164 that is high relative to a selectivity for the layer of insulating material 150. Another step of the etching process may employ an etchant having a selectivity that is higher for the phase change material 160 than for the layer of insulating material 150.

With reference to the two memory cells of FIG. 1 fabricated according to the method of the present invention, the figure does not show the substrate 100 or the insulating material 150. This figure elucidates how the areas of contact 170 and 171 between each of the bottom electrodes 140 and 141 and the phase change material 160 are controlled by the height 175 and the width 180 of the bottom electrodes 140 and 141. The dimensions of the bottom electrodes 140 and 141 can be controlled by deposition/etch processes as described above. These processes make it possible to create contact surfaces 170 and 171 that can be relatively extremely small, thereby decreasing the amount of current required (or, equivalently, increasing the current density available) to cause a phase change in phase change material 160 such as chalcogenide material.

Figure 19:
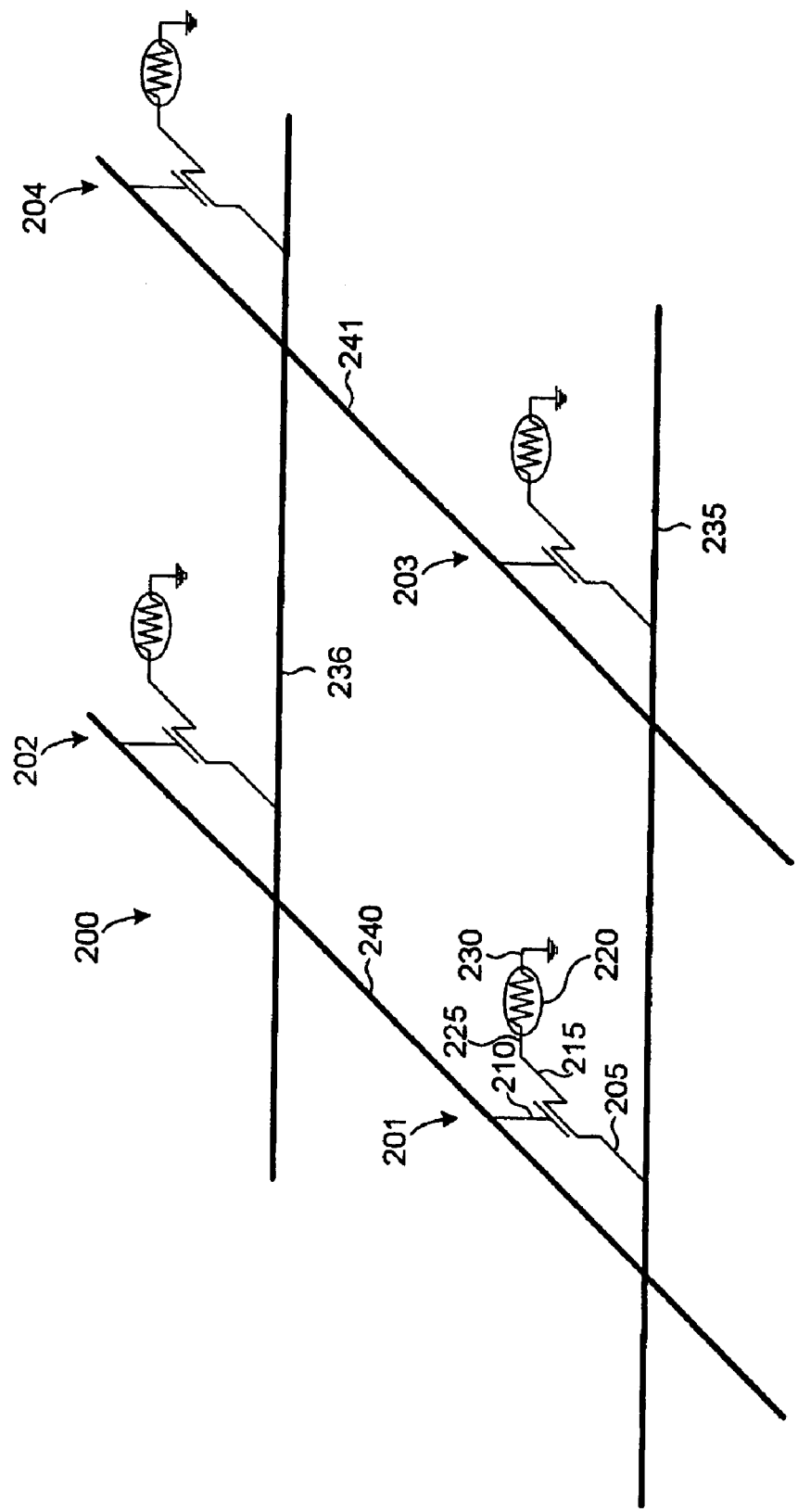
FIG. 19 is a schematic diagram of an exemplary embodiment of a portion of a memory array formed of memory cells fabricated according to a method of the present invention.

FIG. 19 is a schematic diagram of an exemplary embodiment of a portion of a memory array 200 formed of memory cells fabricated according to the method of the present invention. The embodiment illustrated in the diagram comprises four memory cells 201, 202, 203, and 204 in an array that could comprise thousands or even millions of such memory cells formed on a substrate according to the present method. This illustrative memory array 200 is organized as a rectangular array of rows and columns. A memory cell appears at the intersection of each row and column. As previously mentioned, each memory cell may comprise a steering element, e.g. a transistor having a source, a drain, and a gate disposed within the substrate. Each memory cell further comprises a memory element comprising phase change material, the memory element having a bottom electrode and a top electrode. Memory cell 201 in the present illustrative embodiment will now be described in detail with the understanding that each memory cell in the memory array 200 is substantially identical to memory cell 201.

Memory cell 201 comprises a transistor having a source 215, a drain 205, and a gate 210. The gate 210 is operatively connected with a word line 240. The drain 205 of the transistor is operatively connected with a bit line 235. The source 215 of the transistor is operatively connected with a bottom electrode 225 that is operatively connected with a memory element 220. In modified embodiments, the transistor (e.g., the source 215) may be connected to the top electrode 230. In one illustrative embodiment, the source 215 is operatively connected with the bottom electrode 225 through a conducting element at least partially disposed within the substrate. The memory element 220 further is operatively connected with a top electrode 230. The phase change material included in the memory element 220 may comprise, in accordance with a preferred embodiment, a chalcogenide material. The drain of the transistor in memory cell 203 is connected with the same bit line 235 that is connected to the drain 205 of the transistor of memory cell 201.

Bit line 235 thus may define a row of the array 200. Another bit line 236 may define another row of the array 200. The gate of the transistor in memory cell 202 is connected with the same word line 240 that is connected to the gate 210 of the transistor of memory cell 201. Word line 240 thus may define a column of the array. Another word line 241 may define another column of the array.

In view of the foregoing, it will be understood by those skilled in the art that the methods of the present invention can facilitate formation of read only memory devices, and in particular read only memory devices exhibiting dual bit cell structures, in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A memory cell, comprising:
   a first conducting element at least partially disposed within a substrate;
   a pad layer disposed on a surface of the substrate and comprising a top surface, a bottom surface, and at least two sidewalls disposed between the top and bottom surfaces;
   a first bottom electrode at least partially disposed on a surface of the substrate and operatively coupled with the first conducting element, the first bottom electrode begin formed on one of the at least two sidewalls of the pad layer and having dimensions of length, height, and width with the length beings substantially parallel to the substrate and the first bottom electrode including a plane end surface formed substantially at a right angle to the length; and
   phase change material at least partially disposed on the surface of the substrate and forming an operative contact with the plane end surface of the first bottom electrode;
   a second conducting element at least partially disposed within the substrate; and a second bottom electrode formed on another one of the at least two sidewalls of the pad layer, the second bottom electrode being operatively coupled with the second conducting element, wherein the phase change material is operatively coupled with the second bottom electrode.

2. The memory cell as set forth in claim 1, wherein the first and second conducting elements are formed of one or more of tantalum nitride, titanium nitride, titanium tungstide, titanium, tungsten, doped polysilicon, and combinations thereof.

3. The memory cell as set forth in claim 1, wherein the pad layer is disposed between the first bottom electrode and the second bottom electrode.

4. The memory cell as set faith in claim 1, further comprising a top electrode disposed on the phase change material.

5. The memory cell as set forth in claim 1, wherein the phase change material comprises chalcogenide material.

6. The memory cell as set forth in claim 1, wherein the first and second bottom electrodes are formed of one or more of tantalum nitride, titanium nitride, titanium tungstide, titanium, tungsten, doped polysilicon, and combinations thereof.

7. An array of memory cells formed at least partially in a substrate, the array being organized into rows and columns with memory cells at intersection of rows and columns, each memory cell in the array comprising a transistor having a source, a drain, and a gate, the gates of transistors in each column being operatively connected with a common word line, and the drains of transistors in each row being operatively connected wit a common bit line, each memory cell comprising:

a conducting element at least partially disposed within the substrate, the conducting element being operatively connected with the source of a corresponding transistor;

a pad layer disposed on the substrate;

a bottom electrode formed on a sidewall of the pad layer, the bottom electrode being operatively coupled with the conducting element;

phase change material at least partially disposed on the substrate and operatively coupled with a sidewall of the bottom electrode; and a top electrode formed of conducting material disposed on the phase change material and establishing operative contact with the phase change material.

8. The array of memory cells as set forth in claim 7, wherein the phase change material comprises chalcogenide material.

9. A memory cell, comprising:

first and second conducting elements at least partially disposed within a substrate;

a pad layer disposed on a surface of the substrate and comprising a top surface, a bottom surface, and at least two sidewalls between the top and bottom surfaces;

first and second bottom electrodes at least partially disposed on the surface of the substrate and formed on two of the at least two sidewalls, the first and second bottom electrodes being operatively coupled with the first and second conducting elements; and phase change material at least partially disposed on the surface of the substrate and operatively coupled with the first and second bottom electrodes.

10. The memory cell as set forth in claim 9, wherein the first and second conducting elements are formed of tungsten.

11. The memory cell as set forth in claim 9, wherein the pad layer is disposed between the first bottom electrode and the second bottom electrode.

* * * * *